United States Patent [19]
Boyd

[11] Patent Number: 5,883,545
[45] Date of Patent: Mar. 16, 1999

[54] TRAINING METHOD FOR GM-C OR MOS-C CIRCUITS

[75] Inventor: Graeme B. Boyd, North Vancouver, Canada

[73] Assignee: PMC-Sierra Ltd., Canada

[21] Appl. No.: 6,825

[22] Filed: Jan. 14, 1998

[51] Int. Cl.$^6$ .................................................... H03B 1/00
[52] U.S. Cl. ........................................ 327/553; 327/552
[58] Field of Search .................................. 327/552, 553, 327/554, 555, 556, 557, 558

[56] References Cited

U.S. PATENT DOCUMENTS

| | | | |
|---|---|---|---|
| 5,124,593 | 6/1992 | Michel ...................................... | 307/521 |
| 5,180,963 | 1/1993 | El-Sharkawi et al. .................... | 323/211 |
| 5,225,790 | 7/1993 | Noguchi et al. ......................... | 330/260 |
| 5,245,646 | 9/1993 | Jackson et al. .......................... | 377/2 |

Primary Examiner—Timothy P. Callahan
Assistant Examiner—Jeffrey Zweizig
Attorney, Agent, or Firm—Hall, Priddy & Myers

[57] ABSTRACT

A circuit for training a trainable filter circuit having an adjustable time constant, the circuit having a clock generator operative to generate first and second clock signals on first and second clock signal outputs, respectively, of substantially the same amplitude and frequency. A first circuit has a reference filter circuit coupled to the first clock signal output and the second clock signal has the trainable filter circuit coupled to the second clock signal output. Means for adjusting one of the voltage input to and time constant of the reference circuit are provided. An amplifier coupled to an output of the reference circuit and to an output of the trainable filter circuit is operative to produce a DC output when the amplitudes of signals on the reference circuit output and the training circuit output are equal and an AC signal when they are unequal. A separator circuit coupled to an output of said amplifier is operative to rectify the AC signal and to subtract therefrom the DC signal and a feedback line couples an output of the separator circuit to the trainable filter circuit whereby an RC time constant of the trainable loop is modified until said AC signal is zero.

28 Claims, 5 Drawing Sheets

TRAINING METHOD FOR GM-C OR MOS-C CIRCUITS

FIELD

The present invention relates to an integrated circuit used to adjust an RC time constant in a first Gm-C circuit or MOS-C circuit by using a second circuit whose Gm-C or MOS-C circuit is matched to the first Gm-C or MOS-C circuit. A Gm-C circuit is one which uses the transconductance of an amplifier as the resistance required to implement a filter while a MOS-C circuit is one which uses a field effect transistor (FET) to provide the resistance which, in both cases, can be tuned. A scaled value of the RC time constant for the second circuit is matched to the time constant of a reference circuit to establish an analog training signal which is then used to set the RC time constant of the first circuit.

BACKGROUND

Because of process variations in the fabrication of Gm-C or MOS-C circuits, it is difficult to match filter circuits to the accuracy required in many applications. One solution to this problem is to provide on-chip tuning of the Gm-C and MOS-C circuits by comparing the resistors and/or capacitors of the latter-mentioned circuits with an accurate reference resistor and/or capacitor. In the event of a mismatch a comparison circuit generates a control voltage which changes the Gm-C or MOS-C resistance and/or capacitance until a match is obtained. In MOS-C circuits the width and length of the MOS transistors of the filters can be matched to those of a tuning circuit so that the various factors such as fabrication tolerances, operating temperature variations, and aging will affect both MOS transistors the same so that these effects tend to cancel.

It is possible to automatically tune RC products rather than just resistance values by utilizing either an accurate external clock or an accurate on-chip clock. A reference circuit is formed in which the resistors and capacitors of the filter are ratio matched to those of the reference circuit so that the RC products within the reference circuit are also stabilized. The reference circuit is either a duplicate of the filter or of one basic cell of the filter. A phase comparator compares the phase of the reference "filter" output with that of the clock. The comparator outputs a control voltage which adjusts the reference "filter" so that the phase difference is at a predetermined value. This causes the RC products within the reference filter to attain fixed, predetermined values.

Alternately, a voltage controlled oscillator can be used as the reference circuit. A voltage controlled oscillator consists of a phase detector, a loop filter and a voltage controlled oscillator to tune the filter. A phase comparator compares the output of the oscillator with the clock and produces a control voltage which causes the oscillator output to track the clock. The RC products of the oscillator and filter are stabilized by the control voltage as is the frequency response of the filter. Typically phase lock loops require a significant amount of circuitry and hence chip area. In addition they introduce noise at the reference frequency provided for the phase lock loop.

Tuning circuits which feature external reference resistors require initial adjustments and do not compensate well enough for both resistance and capacitance. Often such circuits have offsets which cause frequency tuning errors. Phase locked loop circuits occupy a relatively large area. In addition, it is difficult to build high frequency voltage controlled oscillators that are well-matched to an associated filter U.S. Pat. No. 5,245,646 issued to Jackson et al. discloses a tuning circuit having an integrator with an RC time constant which is proportional to the RC time constant of a filter. The filter uses discrete capacitors and is not continuous. Moreover, series resistors in the tuning circuit and filter limit the frequency to below about 10 MHz.

U.S. Pat. No. 5,124,593 issued to Michel discloses a continuous time filter tuning circuit which applies only to MOSFET-C or MOS-C filters. If the capacitor is not large enough it will create wandering of the MOSFET-C device.

Accordingly, it is an object of the invention to provide an improved training circuit for use in tuning a filter circuit time constant to be a scaled multiple of the RC time constant of a reference filter circuit.

SUMMARY OF THE INVENTION

According to the invention there is provided a circuit for training a trainable filter circuit having an adjustable time constant, the circuit having a clock generator operative to generate first and second clock signals on first and second clock signal outputs, respectively, of substantially the same amplitude and frequency. A first circuit has a reference filter circuit coupled to the first clock signal output and the second clock signal has the trainable filter circuit coupled to the second clock signal output. An adjuster for adjusting one of the voltage input to and time constant of the reference circuit is provided. An amplifier coupled to an output of the reference circuit and to an output of the trainable filter circuit is operative to produce a DC output when the amplitudes of signals on the reference circuit output and the training circuit output are equal and an AC signal when they are unequal. A separator circuit coupled to an output of said amplifier is operative to rectify the AC signal and to subtract therefrom the DC signal and a feedback line couples an output of the separator circuit to the trainable filter circuit whereby an RC time constant of the trainable loop is modified until said AC signal is zero.

Preferably the reference circuit may be a golden RC circuit.

The adjuster for adjusting may be a variable resistor network with a first variable resistor coupled to a first output of the clock generator and an input to the reference circuit, a second variable resistor coupled to a second output of the clock generator and to an input to the trainable filter circuit and a resistor coupled between the input to the reference circuit and to an input to the trainable circuit. A variable resistor control circuit may be coupled to the first and second variable circuit operative to control the relative values of the first and second variable resistors.

Preferably, the second clock signal may be the inverse of the first clock signal.

The amplifier may be a summing amplifier and an output of each of the reference circuit and the trainable circuit may be coupled to the same input of the summing amplifier wherein the gain through each path to the output of the summing amplifier is the same.

The separator circuit may include a low pass filter coupled to an output of said summing amplifier operative to filter AC from an error signal output thereof and produce a DC level for the error voltage and a rectifier circuit coupled to each of an output of the summing amplifier and an output from said low pass filter operative to rectify the error voltage and to pass the DC level of the error voltage alternately on each of two rectifier lines.

The separator circuit may further include a differential amplifier having a pair of inputs, one input coupled to one of the rectifier lines and another coupled to another of the two rectifier lines, whereby an output of the differential amplifier being a DC signal corresponding to the difference between the error signal and the DC level of the error signal.

A feedback line may couple to an output of the differential amplifier and to the trainable circuit.

The output of the differential amplifier may be applied to other Gm-C and MOSFET-C circuits matched to the trainable circuit.

The reference circuit may be a switched capacitor circuit and the means for adjusting may be a pair of clock outputs from the non-overlapping clock generator, $\Phi_3$ and $\Phi_4$, with $\Phi_3$ being 180 degrees out of phase with $\Phi_4$ wherein $\Phi_3$ and $\Phi_4$ are used to switch the switched capacitor circuit.

A low pass filter F3 may be coupled to a non-inverting input to the summing amplifier.

In another aspect of the invention there is provided a method of training a trainable circuit having an adjustable time constant which includes generating first and second clock signals of substantially the same amplitude and frequency, applying the first clock signal to a first circuit having a reference filter circuit and the second clock signal to a second circuit having a trainable filter circuit and adjusting one of the voltage input to and time constant of the reference filter circuit. An error voltage is generated from the outputs of the reference filter circuit and the trainable filter circuit and applied to the trainable filter circuit to modify a time constant thereof.

The trainable filter circuit may be selected from the group consisting of a Gm-C circuit and MOSFET-C circuit.

Preferably, the second clock signal is in phase with the first clock signal.

The error generating step may include summing the voltages at the output of each of the reference filter circuit and the trainable filter circuit to form an AC error signal, filtering the AC error signal to form a DC error signal, rectifying the AC error signal and applying the AC error signal and the DC error signal to a difference amplifier and directing an output of the difference amplifier to the trainable circuit to modify an RC time constant thereof until there is no AC error voltage produced.

The amplifier may be a summing amplifier and an output of each of the reference circuit and the trainable circuit may be coupled to respective inputs of a summing amplifier wherein the gain through each input to an output of the summing amplifier is the same.

The method may further include applying the output of the difference amplifier to a another trainable filter circuit so as to control the RC time constant thereof.

Circuits such as the foregoing can be made to be less than ⅓ of the area it would take for a conventional phase locked loop circuit. The small size assists in matching the master to the slave circuit as then can be closer to each other. Moreover, unlike known circuits the circuit is insensitive to noise and DC offsets.

BRIEF DESCRIPTION OF THE DRAWINGS

Further features and advantages will be apparent from the following detailed description, given by way of example, of a preferred embodiment taken in conjunction with the accompanying drawings, wherein.

DETAILED DESCRIPTION WITH REFERENCE TO THE DRAWINGS

Figure 1:
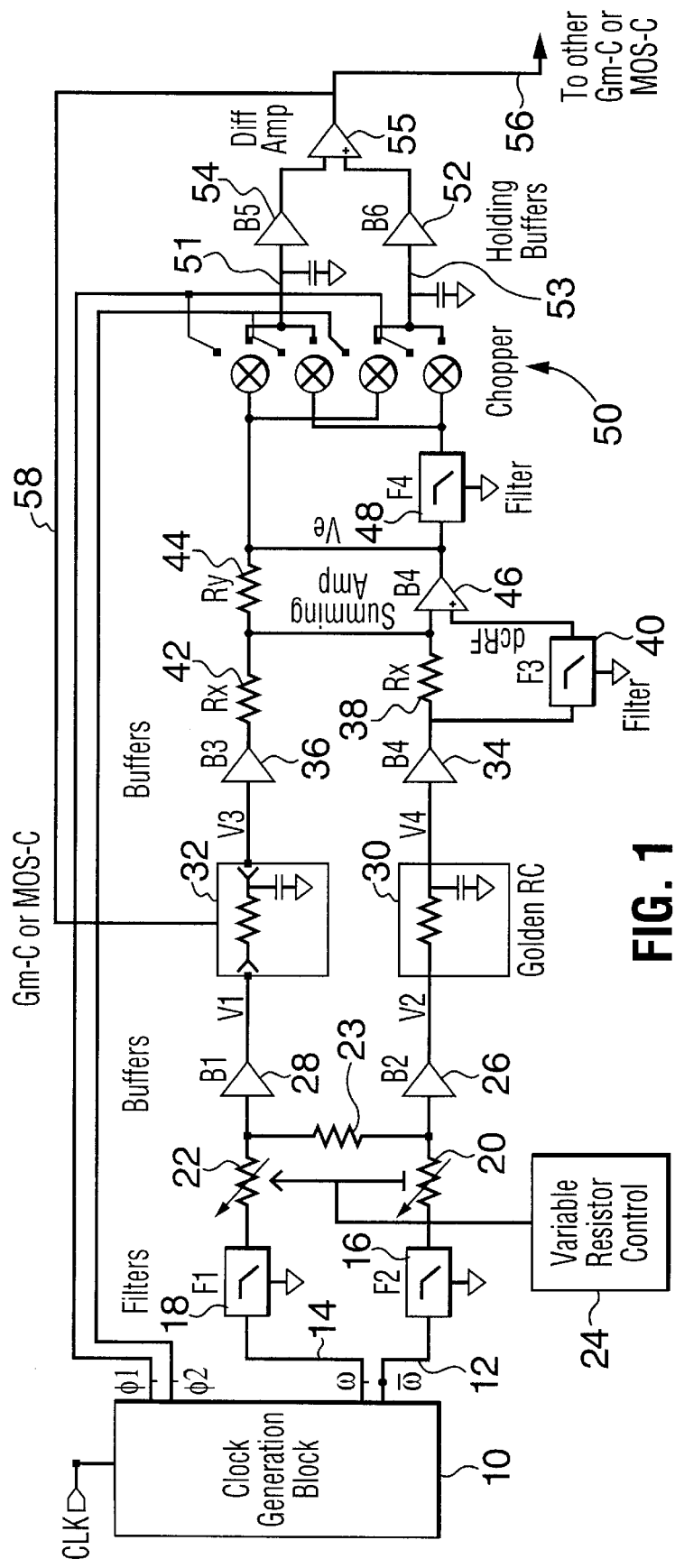
FIG. 1 is a schematic circuit diagram of a training loop in accordance with the invention.
Figure 2:
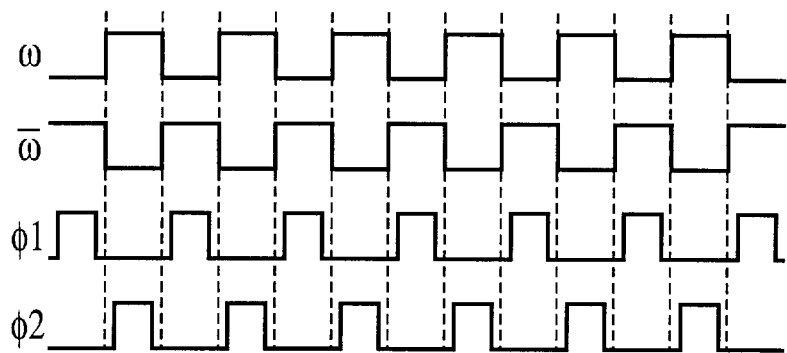
FIG. 2 shows waveform diagrams for four outputs of the clock generation block.
Figure 3:
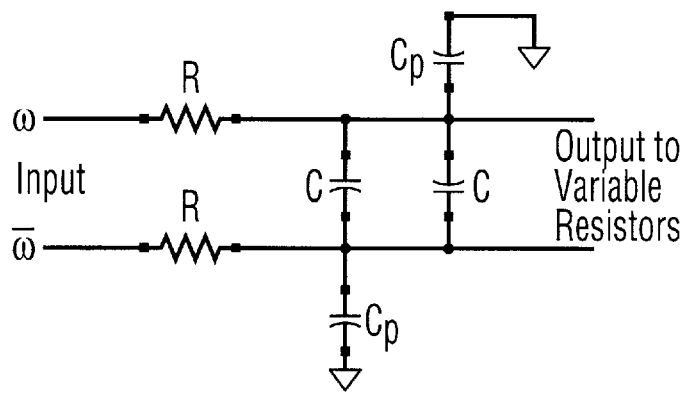
FIG. 3 is a simple implementation of filters F1 and F2 of FIG. 1.

Referring to FIG. 1, clock generation block 10 generates four clock outputs from an external clock, namely, $\omega$, $\overline{\omega}$, $\phi_1$, and $\phi_2$ the waveforms for which are shown in FIG. 2. The clock output $\omega$ is the inverse of $\overline{\omega}$ while clock output $\phi_1$ is 180 degrees out of phase and does not overlap with clock output $\phi_2$. The waveforms for $\phi_1$, and $\phi_2$ have a 50−$\alpha$/50+$\alpha$ duty cycle where $\alpha$ is usually between 5 and 20, whereas the clock for $\omega$ and $\overline{\omega}$ have a 50/50 duty cycle. Clock $\omega$ on line 14 is used to drive a training loop. The clock $\omega$ is filtered by filter 18 (F1) and the inverse output, $\overline{\omega}$, on line 12 is filtered by filter 16. Filters F1 and F2 are used to remove some of the high frequencies from the square wave clock outputs $\omega$ and $\overline{\omega}$. Such filtering is required because Gm-C and MOS-C circuits to which these clock outputs are to be applied become quite non-linear at higher frequencies. The 3 dB point of these filters is not critical (but they must match each other), Hence they can be implemented using a simple RC filter as shown in FIG. 3. The capacitors C are in anti-parallel so that the parasitic capacitance to substrate, Cp, will be equal.

Variable resistors 20 and 22 are coupled to filters F2 and F1, respectively, with resistor 23 bridging the output side of the latter two variable resistors. Buffers 26 and 28 couple variable resistors 20 and 22 to a reference golden RC circuit 30 and to a trainable circuit 32, respectively. Resistors 20 and 22 are set relative to one another by a variable resistor control 24. As a result of adjusting resistors 20 and 22 the voltage values V1 and V2 at the output of buffers 28 and 26, respectively, are set. After filtering by the golden RC circuit 30, the voltage at the output of circuit 30 is V4. Similarly, application of circuit 32 to V1 will cause a voltage V3 to be established at an output of circuit 32. V3 is applied through a buffer 36 to an inverting input of a summing amplifier 46. Resistor Ry 44 is the feedback resistor and resistor Rx 42 is the input resistor for V3.

Figure 6:
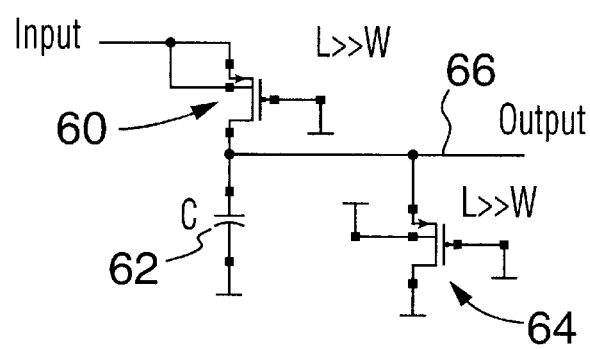
FIG. 6 is a circuit diagram showing an implementation of F3 and F4.

V4 is applied through a buffer 34 (B4) and input resistor Rx 38 to the inverting input of summing amplifier 46. The output of buffer 34 is also fed to a low pass filter 40 (F3) which filters the AC from V4 before it is applied to the non-inverting input of the summing amplifier 46. The output of the summing amplifier 46 is filtered by low pass filter 48 (F4) which filters AC. Filters F3 and F4 have very low frequency 3 dB points but are not required to be very accurate or to match. Hence they can be implemented using a simple, long MOS-C filter. One implementation of these filters is shown in FIG. 6 consisting of an FET 60 with a grounded gate and a plate length much greater than its width coupled to an output line 66 with a capacitor 62 to ground and another FET 64 with both source (drain) and gate coupled to ground from the output line 66 and the length of the plate being much greater than its width. Filters F3 40 and F4 48 prevent any DC offsets from affecting the training loop.

Referring again to FIG. 1, the summing amplifier 46 sums the two out-of-phase signals V3 and V4 and has an output Ve which is an error voltage signal. If V3 and V4 are equal but 180 degrees out-of-phase then Ve has only a DC value. The latter would be the condition when trainable filter circuit 32 has been trained to a desired time constant. The gain of the summing amplifier 46 is set by the values of Rx and Ry, which would usually be between 1 and 10. The bandwidth of this amplifier 46 must be high enough to allow the signal frequency to pass ω. The DC offset of this amplifier does not matter as long as it does not vary quickly over time.

A chopper 50 acts as a full wave rectifier of the error voltage so that its output is either the rectified error voltage Ve at the output of summing amplifier 46 or the DC level of the error voltage after being filtered by filter 48. The signals from the chopper are each fed into buffers 52 and 54, respectively, and then into differential amplifier 55. When clock $\Phi_1$ is high, Ve is applied to line 51 while the DC level of the error voltage is applied to line 53. When clock $\Phi_2$ is high, the DC level of the error voltage is applied to line 51 while Ve is applied to line 53. Thus, the differential amplifier 55 always has the rectified value of Ve on one of its inputs and the DC level of the error voltage, Vedc, on the other. The output voltage of the differential amplifier 55 is given by the following:

$$V_{out} = A|(V_e - V_{edc})|\eta$$

where the symbol ∥ means rectified,

Ve=−(Ry/Rx)×(V3+V4)+V4$_{dc}$×(1+2Ry/Rx),

A=differential amplifier open loop gain, and

η=rectifier (or chopper) efficiency.

By adjusting the relative value of the variable resistors 20 and 22 one sets the voltages V1 and V2. The feedback circuit will then try to force V3 to be equal (but out of phase) with V4. Once the latter condition is reached i.e., a matched condition, the time constant of the trainable circuit has reached a desired value. At this condition, the rectified value of Ve will be the same as the DC level of the error voltage, Vedc, and the output of the differential amplifier 55 will give the desired training level. If the frequency of the clock outputs ω and $\overline{\omega}$ are greater than 4/(golden RC circuit time constant), greater than 4/(Gm-C time constant) or 4/(MOS-C time constant) then the Gm-C or MOS-C time constant will be approximated by V1/V2 times the golden RC time constant. The factor 4 comes from the difference between the ideal gain rolloff of a single pole and the real rolloff (the higher the factor, the lower the error). Of course, for a value of less than 4, the ratios of the time constants are still calculable but are no longer a nice ratio.

The output of the differential amplifier 55 on line 56 functions as the controlling voltage for the trainable Gm-C or MOS-C circuit 32. The same voltage may be applied to other Gm-C and MOS-C circuits that are matched to circuit 32. Such an application is very useful when such other circuits are operating at frequencies much higher than those of circuits 30 and 32 where operation in a training circuit such as FIG. 1 would be impractical.

Figure 4A:
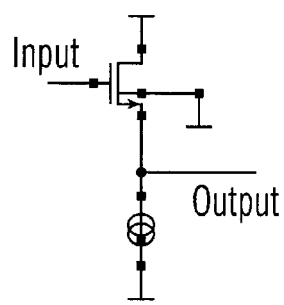
FIGS. 4A, 4B and 4C show implementations of buffers B1, B2, B3, B4, B5, and B6.
Figure 4B:
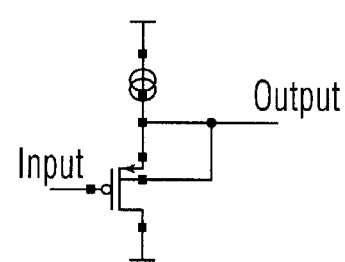
Figure 4C:
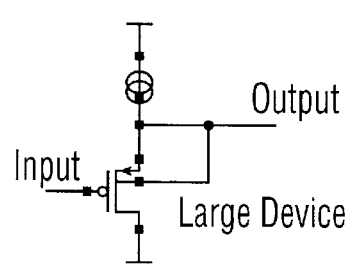

Referring to FIGS. 4a, 4b, and 4c, there are shown simple implementations of buffers B1 and B2, B3 and B4, and B5 and B6, respectively. FIG. 4a shows a simple NMOS source follower while FIGS. 4b and 4c show simple PMOS source follower circuits. These buffers are needed to prevent loading of the previous circuitry. Buffers B5 and B6 together with their preceding capacitors to ground are used as a hold circuit and can be implemented as a large source follower in which the parasitic gate capacitance is used instead of a separate capacitor. The DC offset matching of these buffers do not matter as long as they do not vary quickly over time.

Figure 5:
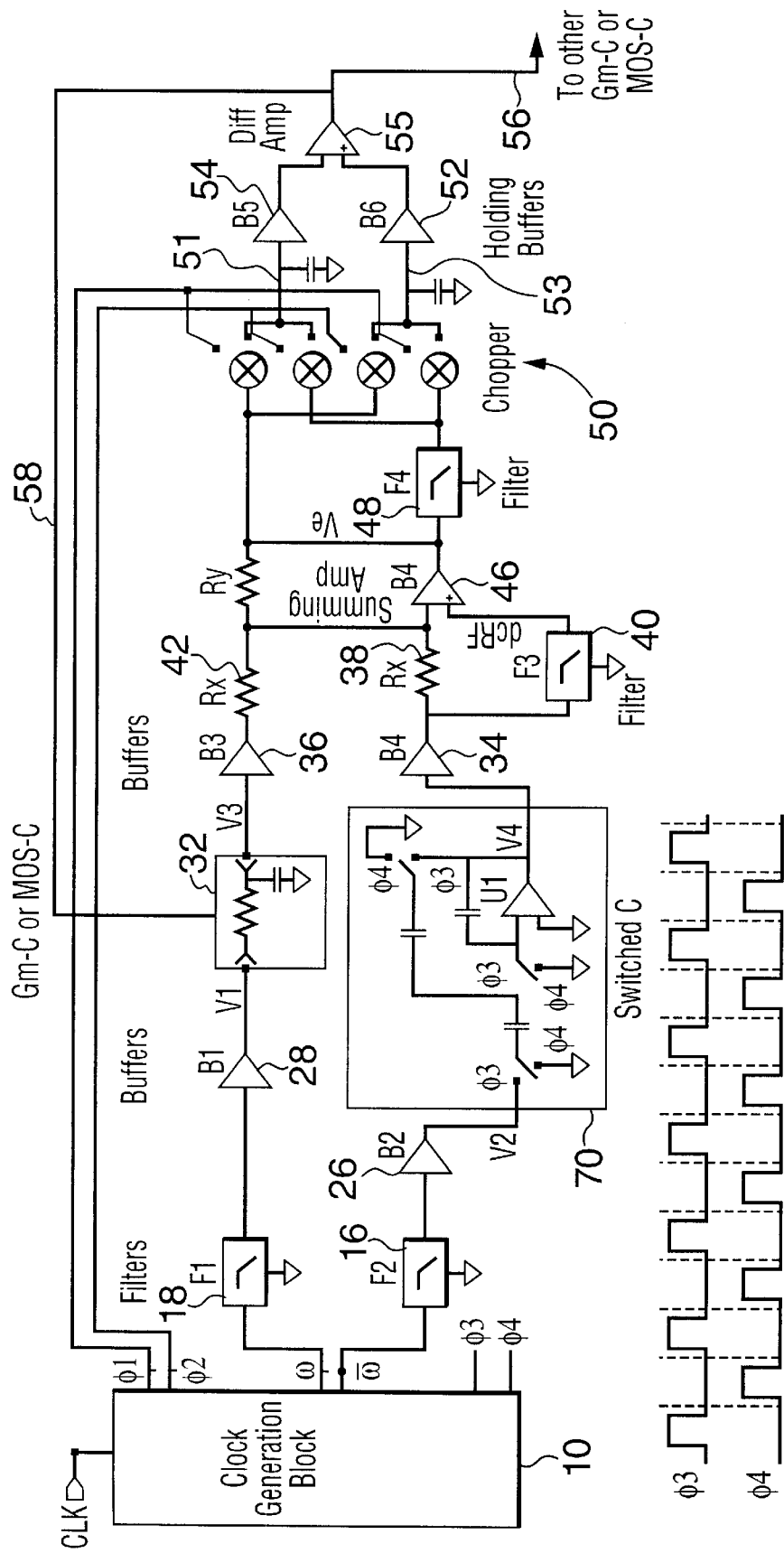
FIG. 5 is a schematic circuit diagram as in FIG. 1 but with a switched capacitor in place of the golden RC.

Referring to FIG. 5, there is shown a circuit in which a switched capacitor circuit 70 replaces the golden RC circuit 30 and the variable resistors 20 and 22 and resistor 23. In FIG. 5, like parts to those of FIG. 1 have like numbers. The effective resistance of the switched capacitor network changes with changes in the switching frequency which substitutes for the scaling provided by the variable resistors 20 and 22 in FIG. 1. The switching frequency of the switches must be high enough so as not to interfere with the rest of the circuit. Otherwise a continuous time filter must be used after the switched circuit to smoothen things out. The latter filter would affect the performance of the rest of the circuit.

Referring to FIG. 6, a simple implementation of F3 and F4 is shown as consisting of an FET 60 whose source is coupled to the input, the length of whose gate is much longer than it is wide, its gate grounded and its drain coupled to an output line 66. Output line 66 is grounded through capacitor 62 and though another FET 64 whose gate and drain are grounded and whose gate is much longer than its width.

Figure 7:
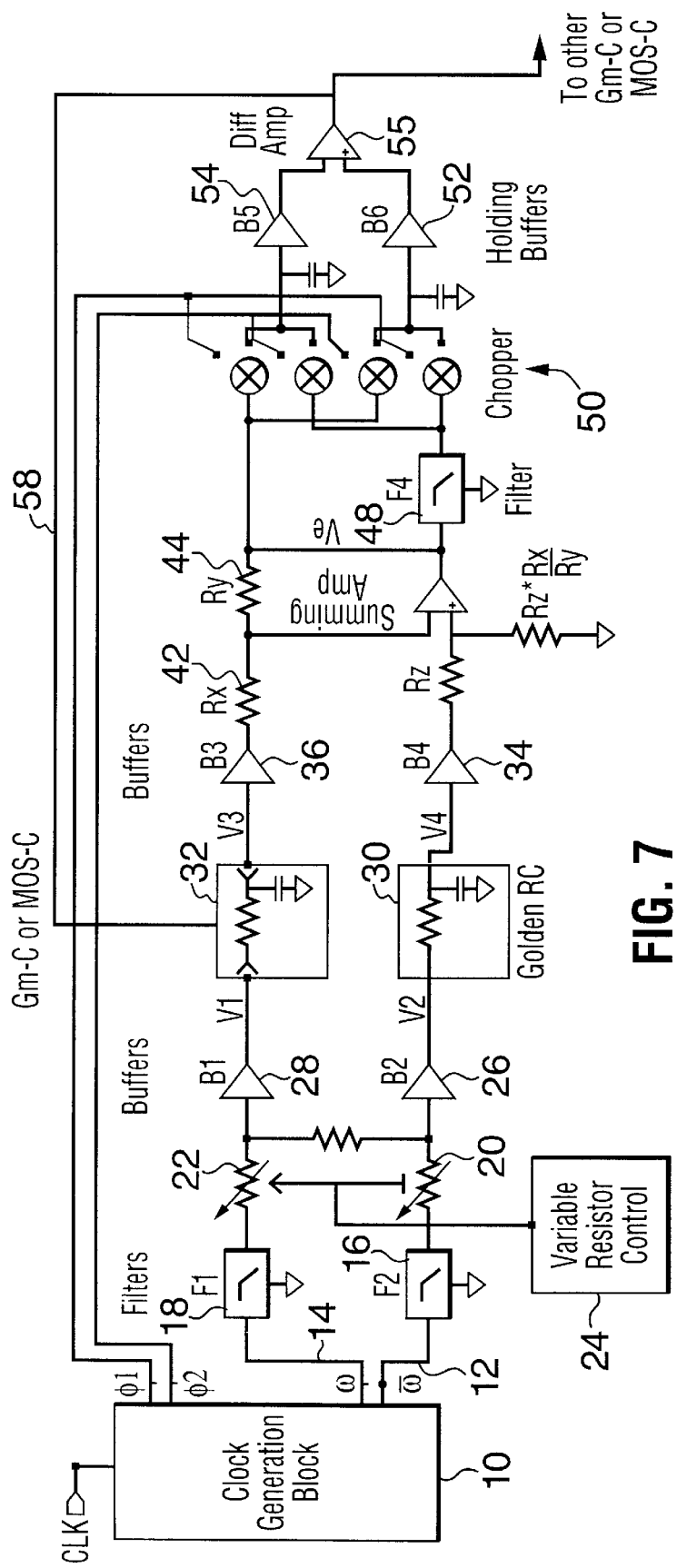
FIG. 7 is a circuit diagram in which the filter F3 has been removed and the requirement of differential clocks is removed.

Referring to FIG. 7 which is again identical to FIG. 1 except that V4 is fed through buffer B4 to the non-inverting input of the summing amplifier into resistor Rz and in which the non-inverting input is coupled to ground through resistance Rz(Rx/Ry). Here again like numbers refer to like parts. This is useful when a differential clock ω and $\overline{\omega}$ are not available (i.e., one needs only ω), however, the DC offsets must be low enough so that the summing amplifier does not saturate.

Instead of using a full wave chopper rectifier, one can also use a full or half wave rectifier of any type. Higher order systems can be used for the golden RC and the MOS-C and Gm-C sections instead of simple first order systems.

It is not necessary to have a differential system in which ω and $\overline{\omega}$ are the inverse of each other. However, the DC offsets must be low enough so that the summing amplifier does not saturate.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A circuit for training a trainable filter circuit having an adjustable time constant, comprising:

(a) a clock generator operative to generate first and second clock signals on first and second clock signal outputs, respectively, of substantially the same amplitude and frequency;

(b) a first circuit having a reference filter circuit coupled to said first clock signal output and said second clock signal having the trainable filter circuit coupled to said second clock signal output;

(c) means for adjusting one of the voltage input to and time constant of the reference circuit;

(d) an amplifier coupled to an output of said reference circuit and to an output of said trainable filter circuit operative to produce a DC output when the amplitudes of signals on said reference circuit output and said training circuit output are equal and an AC signal when they are unequal;

(e) a separator circuit coupled to an output of said amplifier operative to rectify the AC signal and to subtract therefrom said DC signal; and (f) a feedback line coupling an output of said separator circuit to said trainable filter circuit whereby an RC time constant of said trainable loop is modified until said AC signal is zero.

2. A circuit according to claim 1, wherein said reference circuit is a golden RC circuit.

3. A circuit according to claim 2, wherein said means for adjusting is a variable resistor network with a first variable resistor coupled to a first output of said clock generator and an input to said reference circuit, a second variable resistor coupled to a second output of said clock generator and to an input to said trainable filter circuit and a resistor coupled between said input to said reference circuit and to an input to said trainable circuit and a variable resistor control circuit coupled to said first and second variable circuit operative to control the relative values of said first and second variable resistors.

4. A circuit according to claim 1, wherein said second clock signal is the inverse of said first clock signal.

5. A circuit according to claim 4, wherein said amplifier is a summing amplifier and wherein an output of each of said reference circuit and said trainable circuit are coupled to an input to said summing amplifier wherein the gain through said summing amplifier of each of said reference circuit and said trainable is the same.

6. A circuit according to claim 5, wherein said separator circuit includes a low pass filter coupled to an output of said summing amplifier operative to filter AC from an error signal output thereof and produce a DC level for the error voltage and a rectifier circuit coupled to each of an output of said summing amplifier and an output from said low pass filter operative to rectify said error voltage and to pass the DC level of the error voltage alternately on each of two rectifier lines.

7. A circuit according to claim 6, wherein said separator circuit includes a differential amplifier having a pair of inputs, one input coupled to one of said rectifier lines and another coupled to another of said two rectifier lines, whereby an output of said differential amplifier being a DC signal corresponding to the difference between the error signal and the DC level of the error signal.

8. A circuit according to claim 7, wherein a feedback line couples to an output of said differential amplifier and to said trainable circuit.

9. A circuit according to claim 8, wherein the output of said differential amplifier is applied to other Gm-C and MOSFET-C circuits matched to said trainable circuit.

10. A circuit according to claim 1, wherein said reference circuit is a switched capacitor circuit and said means for adjusting is a pair of clock outputs from said clock generator, $\Phi_3$ and $\Phi_4$, $\Phi_3$ being 180 degrees out of phase with $\Phi_4$ wherein $\Phi_3$ and $\Phi_4$ are used to switch said switched capacitor circuit.

11. A circuit according to claim 5, including a low pass filter F3 coupled to a non-inverting input to said summing amplifier.

12. A circuit for training transconductance-capacitance (gm-C) and MOSFET-C filter circuits to correct for fabrication process tolerances, comprising:

(a) a clock generation circuit operative to produce output frequency signals A, B, wherein signals A and B are of the same frequency;

(b) filters F1 and F2 coupled to output clock signals ω and $\overline{\omega}$, respectively, from said clock generation circuit and operative to filter at least some output high frequency signal components in output clock signals ω and $\overline{\omega}$ to reduce instability in said gm-C and MOSFET-C filter circuits;

(c) a reference circuit coupled to an output of F2 and operative to provide an adjustable RC time constant and an output voltage V4;

(d) a trainable filter circuit capable of having its time constant scaled based upon the time constant of said reference circuit and providing an output V3;

(e) a summing amplifier coupled to both V3 and V4 and operative to generate an error voltage Ve;

(f) a DC offset filtering circuit coupled to said summing amplifier operative to remove dc offsets;

(g) an F4 filter circuit coupled to an output of said summing amplifier to filter AC from said output;

(h) a rectifier circuit coupled to an output of said summing amplifier and to an output of said F4 filter operative to provide outputs on each of first and second rectifier output lines in which the output is alternately the rectified value of the error voltage and the dc value of the error voltage with the output on said first rectifier output line being out of phase with respect to an output on said second rectifier output line;

(i) a comparator having a first input coupled to said first rectifier output and a second input coupled to said second rectifier output so as to generate a training circuit output voltage which is proportional to the rectified difference between the error voltage and a dc value of the error voltage; and (j) a feedback line coupled to an output of said comparator and to said trainable circuit.

13. A circuit according to claim 10, wherein said reference circuit includes:

(a) a variable resistance coupled to an output of each of said F1 and F2 filters to establish voltages V1 and V2, respectively; and (b) a reference golden RC circuit having an input coupled to V1 and providing an output voltage V4.

14. A circuit according to claim 13, wherein said golden RC circuit is trimmed during fabrication or testing.

15. A circuit according to claim 12, wherein said clock signals A and B are of the same frequency but of opposite phase.

16. A circuit according to claim 12, wherein said reference circuit includes a switched capacitor circuit and said clock generator generates signals $\Phi_3$ and $\Phi_4$ which are of the same frequency but of opposite phase.

17. A circuit according to claim 16, wherein signals $\Phi_3$ and $\Phi_4$ are of adjustable frequency so as to vary the time constant of the switching capacitor circuit and are at least approximately 8 times higher than the frequency of clock signals A and B so as not to interfere with a remainder of said circuit.

18. A circuit according to claim 12, wherein said rectifier is a chopper circuit.

19. A circuit according to claim 18, wherein said clock generator also generates clock signals $\Phi_1$ and $\Phi_2$ which drive the chopper circuit and have the same frequency as clock signals A and B and where signal $\Phi_1$ is of opposite phase to signal $\Phi_2$.

20. A circuit according to claim 12, wherein a 3 dB point reduction in the logarithm of gain as a function of frequency of filters F1 and F2 match each other.

21. A circuit according to claim 12, wherein filters F3 and F4 have 3 dB points which are substantially lower than those of filters F1 and F2.

22. A circuit according to claim 12, wherein said summning amplifier includes a dc filter F3 coupled to its non-inverting input to remove dc offsets.

23. A circuit according to claim 12, wherein said summing amplifier has a bandpass sufficiently high to permit signals A and B to pass.

24. A method of training a trainable filter circuit having an adjustable time constant, comprising:

(a) generating first and second clock signals of substantially the same amplitude and frequency;

(b) applying said first clock signal to a first circuit having a reference filter circuit and said second clock signal to a second circuit having a trainable filter circuit;

(c) adjusting one of the voltage input to and time constant of the reference filter circuit;

(d) generating an error voltage from the outputs of the reference filter circuit and the trainable filter circuit; and (e) applying said error voltage to said trainable filter circuit to modify a time constant thereof.

25. A method according to claim 24, wherein said trainable filter circuit is selected from the group consisting of a Gm-C circuit and MOSFET-C circuit.

26. A method according to claim 24, wherein said second clock signal is an inverse of said first clock signal.

27. A method according to claim 24, wherein said error generating step includes summing the voltages at the output of each of the reference filter circuit and the trainable filter circuit to form an AC error signal, filtering said AC error signal to form a DC error signal, rectifying said AC error signal and applying said AC error signal and said DC error signal to a difference amplifier and directing an output of the difference amplifier to said trainable circuit to modify an RC time constant thereof until there is no AC error voltage produced.

28. A method according to claim 27, including applying the output of said difference amplifier to a another trainable filter circuit so as to control the RC time constant thereof.

* * * * *